United States Patent
Cho et al.

(10) Patent No.: US 7,274,598 B2
(45) Date of Patent: Sep. 25, 2007

(54) NONVOLATILE INTEGRATED CIRCUIT MEMORY DEVICES HAVING STAGED APPLICATION OF PROGRAM VOLTAGES AND METHODS FOR PROGRAMMING THE SAME

(75) Inventors: Ji-Ho Cho, Gyeonggi-do (KR); Myong-Jae Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 109 days.

(21) Appl. No.: 11/199,425

(22) Filed: Aug. 8, 2005

(65) Prior Publication Data

US 2006/0087886 A1    Apr. 27, 2006

(30) Foreign Application Priority Data

Oct. 25, 2004   (KR) ............... 10-2004-0085469

(51) Int. Cl.
*G11C 11/34* (2006.01)
(52) U.S. Cl. .................... 365/185.18; 365/194
(58) Field of Classification Search ........ 365/185.18, 365/194, 185.19
See application file for complete search history.

(56) References Cited

U.S. PATENT DOCUMENTS

| | | | | |
|---|---|---|---|---|
| 5,748,531 A | * | 5/1998 | Choi ............... | 365/185.18 |
| 6,529,413 B2 | * | 3/2003 | Lee et al. ......... | 365/185.22 |
| 6,667,907 B2 | * | 12/2003 | Chaya et al. ...... | 365/185.18 |
| 6,754,109 B1 | | 6/2004 | Fastow et al. ..... | 365/185.28 |

FOREIGN PATENT DOCUMENTS

| | | |
|---|---|---|
| KR | 100192572 | 1/1999 |
| KR | 1020000054882 | 9/2000 |
| KR | 1020010060574 | 7/2001 |

* cited by examiner

*Primary Examiner*—Van Thu Nguyen
*Assistant Examiner*—N Nguyen
(74) *Attorney, Agent, or Firm*—Myers Bigel Sibley & Sajovec (57) ABSTRACT

A nonvolatile integrated circuit memory device includes a memory cell array having a plurality of memory cells. A high voltage generating unit generates first, second, and third program voltages used in programming the memory cell array. A program control unit controls times of applying the second and third program voltages to the memory cell array responsive to the first program voltage. Programming methods for the nonvolatile integrated circuit memory devices are also provided.

35 Claims, 8 Drawing Sheets

Fig. 1

(PRIOR ART)

NONVOLATILE INTEGRATED CIRCUIT MEMORY DEVICES HAVING STAGED APPLICATION OF PROGRAM VOLTAGES AND METHODS FOR PROGRAMMING THE SAME

CROSS-REFERENCE TO RELATED APPLICATION

This application is related to and claims priority under 35 U.S.C. § 119 from Korean Patent Application 2004-85469 filed on Oct. 25, 2004, the entire contents of which are hereby incorporated by reference.

BACKGROUND OF THE INVENTION

The present invention relates to integrated circuit devices and more particularly integrated circuit memory devices and methods for programming the same.

A variety of nonvolative integrated circuit (semiconductor) memory device types are known. One such nonvolatile semiconductor memory device that is capable of being electrically programmed, erased and read, NOR-type flash memory devices, are typically used in applications where information is read at a high speed, as such memories may support high frequency program and read operations relative to other types of nonvolatile memory devices.

Figure 1:
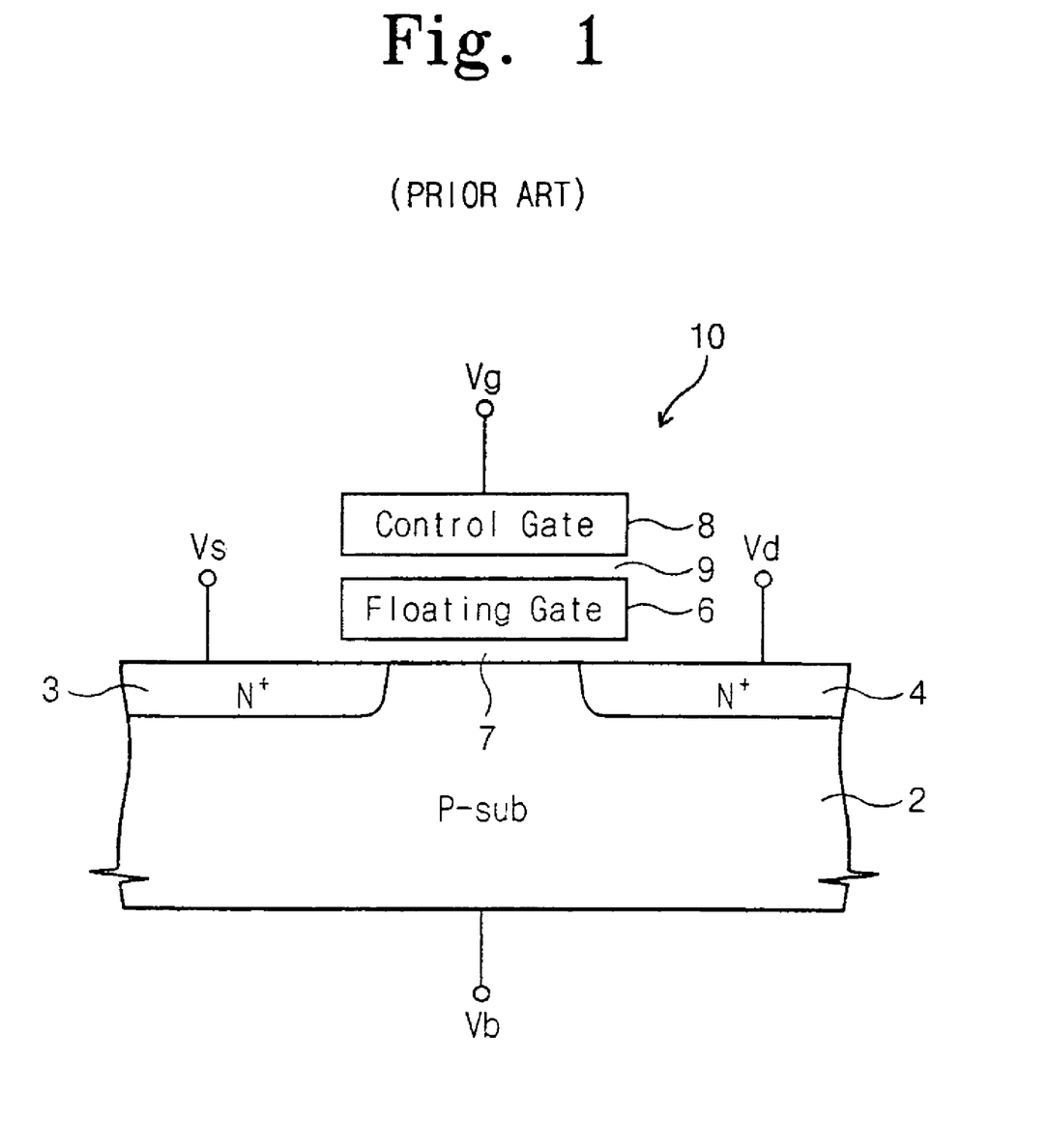
FIG. 1 is a cross-sectional view illustrating a conventional flash memory cell.

FIG. 1 is a cross-sectional view illustrating a conventional flash memory cell 10. The flash memory cell 10 includes a source region 3 and a drain region 4, which are formed of N+ impurities and spaced apart from each other in a P-type semiconductor substrate (or bulk) 2. A gate oxide film 7, having a thickness less than 100 Å, is formed on a channel region between the source and drain regions 3, 4 of the semiconductor substrate 2. A floating gate 6 is formed on the gate oxide film 7. An interlayer dielectric film 9, such as an oxide/nitride/oxide (ONO) film, is formed on the floating gate 6, and a control gate 8 is formed on the interlayer dielectric film 9. For the structure of the flash memory cell 10, voltage terminals Vs, Vg, Vd, and Vb are shown as electrically connected to the source region 3, the control gate 8, the drain region 4, and the semiconductor substrate 2, respectively, in order to apply voltages thereto during programming, erasing, and reading operations and/or to read voltages therefrom.

The flash memory device 10 of FIG. 1 is typically programmed by channel hot electron (CHE) injection, toward a floating gate 6, generated in a channel area adjacent to the drain region 4. The CHE injection is typically induced by grounding the source region 3 and the P type semiconductor substrate 2, and applying a high voltage, of about 10V, to the control gate electrode Vg. In order to generate the hot electrons from the drain region 4, an appropriate positive voltage, such as about 5V to about 6V is applied thereto. When the flash memory cell 10 is programmed by applying voltages, negative charges are generally accumulated in the floating gate 6. The negative charges stored in the floating gate function to increase a threshold voltage of the programmed flash memory cell during a reading operation.

After programming of the flash memory cell, one known problem is a drain turn-on phenomenon that may become a major problem affecting the reliability of the flash memory cell and its operational characteristics.

As described above, to program a memory cell by means of the effect of the CHE injection, a high voltage of about 10V is applied to a wordline (i.e., the control gate) of a selected memory cell and a voltage of about 5V is applied to a bitline (namely, the drain) of a selected memory cell. During this operation, in deselected memory cells connected to the same bitline with the selected memory cell, although the wordline is grounded, a voltage from 0.7V to 0.8 V can be coupled to the floating gate 6 due to coupling capacitance (where a coupling rate is about 0.1) between the drain 4 and the floating gate 6. As a result, a considerable amount of sub-threshold leakage current may flow through the deselected memory cells. This is typically referred to as a drain turn-on problem. The greater the number of memory cells connected to the bitline in common, the more the sub-threshold leakage current generally flows through the deselected memory cells during a programming operation. When an excessive drain turn-on problem occurs, a undesirable voltage drop may occur along the bitline. This may cause a program voltage applied to a drain of the selected cell to be reduced, which may result in the deterioration of programming reliability.

SUMMARY OF THE INVENTION

Embodiments of the present invention provide methods of programming a nonvolatile integrated circuit memory device. First, second, and third program voltages are generated for use in programming memory cells of the memory device. Times of applying the second and third program voltages to the memory cells are controlled responsive to a level of the first program voltage.

In some embodiments of the present invention, controlling times of applying program voltages includes applying the first program voltage to a bulk region of the memory cells and applying the second and third program voltages to a memory cell to be programmed responsive to the applied first program voltage reaching a predetermined level. Applying the second and third program voltages may include applying the second program voltage to a bitline of the memory cell to be programmed responsive to the first program voltage reaching the predetermined level and then applying the third program voltage to a wordline of the memory cell to be programmed responsive to the first, second, and third program voltages reaching predetermined levels.

In other embodiments of the present invention, applying the third program voltage to a wordline of the memory cell to be programmed includes stepping up the third program voltage to provide a stepping voltage signal and applying the stepping voltage signal to the wordline. The first program voltage may be a negative voltage and the predetermined voltage of the first program voltage may be a predetermined negative level. The second program voltage may be a positive voltage having a predetermined desired positive level and the third program voltage may be a positive voltage having a predetermined desired positive level higher than the predetermined desired positive level of the second program voltage. The third program voltage may be a stepping voltage increasing by stages. A program operation may begin responsive to applying of the third program voltage. The nonvolatile integrated circuit memory device may be a flash memory device.

In further embodiments of the present invention, methods of programming a nonvolatile integrated circuit memory device include generating first, second, and third program voltage for use in programming memory cells of the memory device. The first, second, and third program voltages are sequentially applied to the memory cells at predetermined intervals. The nonvolatile memory device may be a flash memory device and sequentially applying the program voltages may include applying the first program voltage to a bulk region of the memory cells, applying the second program voltage to a bitline of a memory cell to be programmed a first predetermined time after applying the first program voltage, and applying the third program voltage to a wordline of the memory cell to be programmed a second predetermined time after applying the first program voltage.

In yet other embodiments of the present invention, applying the third program voltage includes applying the third program voltage a delay time after applying the second program voltage and the second predetermined time is the first predetermined time combined with the delay time after applying the second program voltage. The first program voltage may be a predetermined negative voltage and the second program voltage may be a predetermined positive voltage. The first predetermined time may be selected to allow the first program voltage reach a desired stabilized level. The third program voltage may be a positive voltage higher than the second program voltage and may be a stepping voltage that increases by stages. A program operation may begin responsive to applying of the third program voltage.

In other embodiments of the present invention, nonvolatile integrated circuit memory devices include a memory cell array having a plurality of memory cells. A high voltage generating unit generates first, second, and third program voltages used in programming the memory cell array. A program control unit controls times of applying the second and third program voltages to the memory cell array responsive to the first program voltage. The nonvolatile integrated circuit memory device may be a flash memory and the program control unit may be configured to control times of applying the second and third program voltages responsive to a level of the first program voltage.

In further embodiments of the present invention, the high voltage generating unit includes a pumping circuit that generates the first, second, and third program voltages responsive to a program command and a level detector that detects voltage levels of the first, second, and third program voltages. The first program voltage may be applied to a bulk region of the memory cell array and may be a predetermined negative voltage.

In other embodiments of the present invention, the program control unit includes a first controller that applies the second program voltage to a bitline of a memory cell to be programmed when the first program voltage reaches a predetermined level and a second controller that applies the third program voltage to a wordline of the memory cell to be programmed when the first, second, and third program voltages all reach predetermined levels. The second controller may further include a delay circuit that delays applying the third program voltage for a predetermined time period. The second program voltage may be a predetermined positive voltage and the third program voltage may be a positive voltage higher than the second program voltage.

In further embodiments of the present invention, the nonvolatile memory device is a flash memory device and the program control unit is configured to sequentially apply the first, second, and third program voltages to the memory cell array at predetermined intervals. The high voltage generating unit may include a pumping circuit that generates the first, second, and third program voltages responsive to a program command and a level detector that detects voltage levels of the first, second, and third program voltages. The pumping circuit may apply the first program voltage to a bulk region of the memory cell array and the program control unit may include a first controller that applies the second program voltage to a bitline of a memory cell to be programmed a predetermined time after applying of the first program voltage and a second controller that applies the third program voltage to a wordline of the memory cell to be programmed a predetermined time after applying of the second program voltage.

In yet other embodiments of the present invention, the first controller includes a delay circuit that delays applying the second program voltage for a predetermined time and the second controller includes a delay circuit that delays applying the third program voltage for a predetermined time. The second controller may be configured to apply the third program voltage to the wordline of the memory cell to be programmed only when the first, second, and third program voltages all become predetermined levels.

BRIEF DESCRIPTION OF THE DRAWINGS

The present invention will now be described with reference exemplary embodiments illustrated in the attached drawings in which.

DETAILED DESCRIPTION OF THE INVENTION

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, it will be described about an exemplary embodiment of the present invention in conjunction with the accompanying drawings.

Nonvolatile memory devices and methods for programming the same according to some embodiments of the present invention include controlling an applying timing of a program voltage so that a high voltage is sequentially applied to a bitline and a wordline after a negative voltage to be applied to a bulk region is sufficiently reduced (i.e., after a predetermined time elapses to allow the negative voltage to be charged into the bulk region). As a result, leakage of current toward a deselected memory cell during a program operation may be reduced or prevented, which may improve programming reliability and reduce errors.

Figure 2:
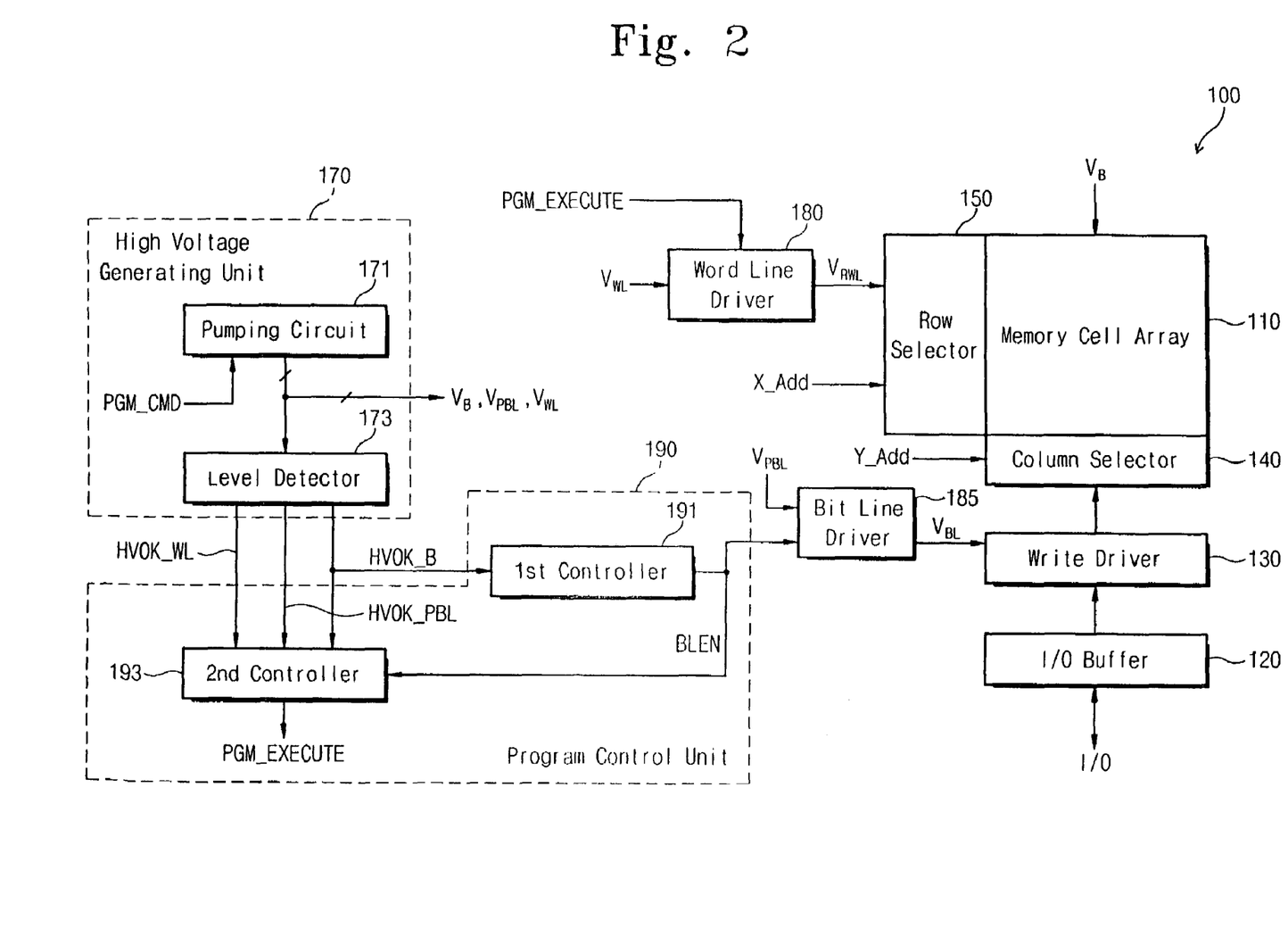
FIG. 2 is a circuit block diagram illustrating a nonvolatile integrated circuit (semiconductor) memory device, such as a flash memory device, according to some embodiments of the present invention.
Figure 3:
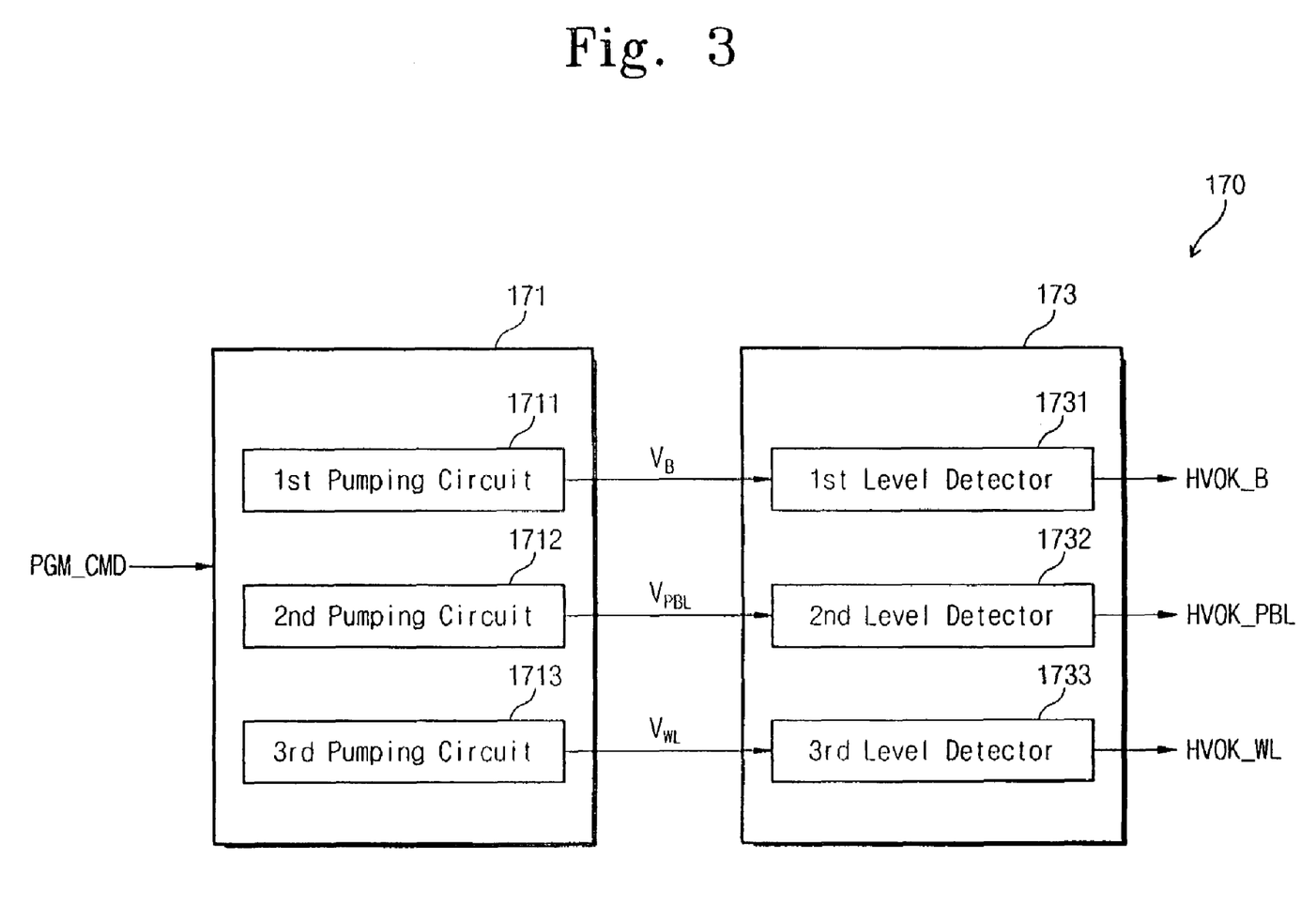
FIG. 3 is a more detailed block diagram of the high voltage generating unit shown in FIG. 2 according to some embodiments of the present invention.
Figure 4:
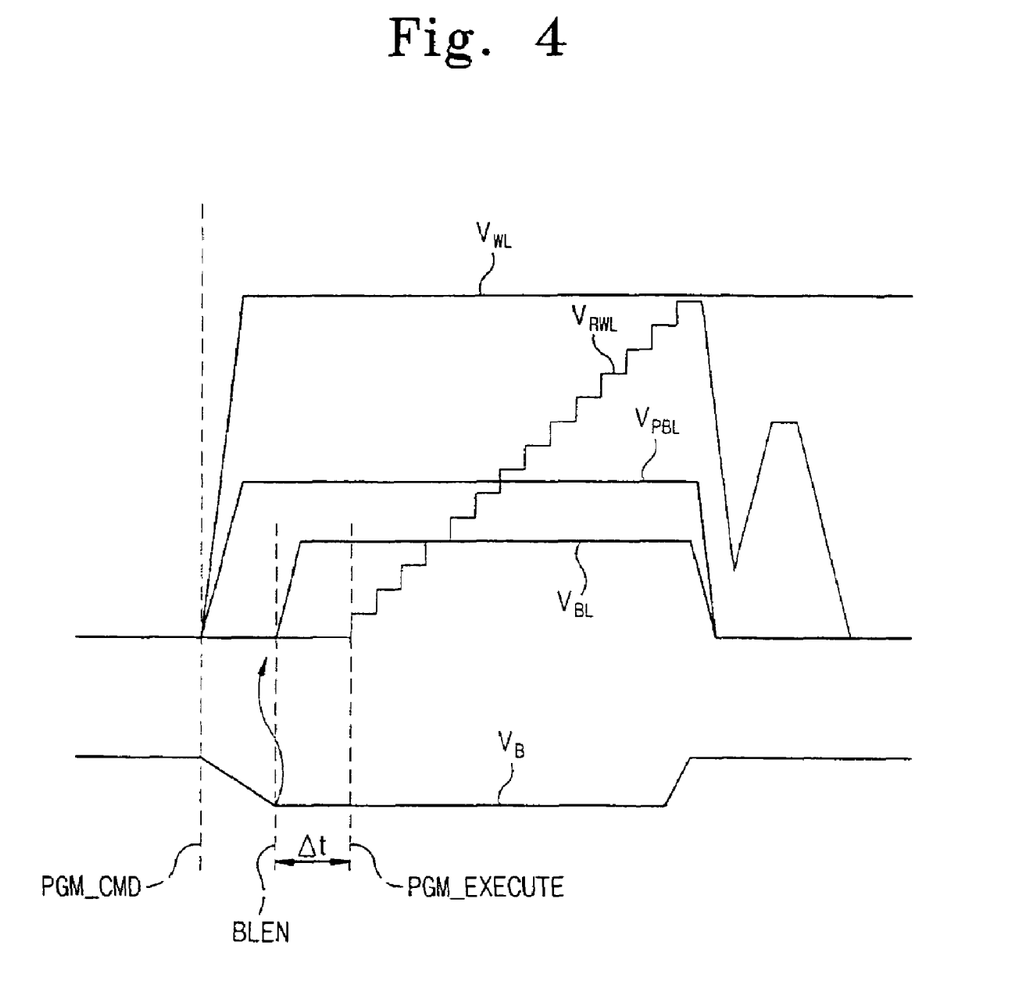
FIG. 4 is a waveform graph illustrating program voltages that are applied to the nonvolatile semiconductor memory device shown in FIG. 2 according to some embodiments of the present invention.

Some embodiments of the present invention will now be described with reference to FIGS. 2-4. FIG. 2 is a circuit block diagram illustrating a nonvolatile semiconductor memory device 100 according to some embodiments of the present invention. FIG. 3 is a more detailed block diagram of the high voltage generating unit 170 shown in FIG. 2 according to some embodiments of the present invention. FIG. 4 is a waveform graph illustrating a plurality of voltages VB, VPBL, VBL, VWL, and VRWL that are generated in the nonvolatile semiconductor memory device 100 shown in FIG. 2, to execute program operation, according to some embodiments of the present invention. The voltages VB, VBL, and VRWL may be applied to the nonvolatile semiconductor memory device 100 during a program operation. In FIG. 2, only one array block among a plurality of array blocks that may be included in the nonvolatile memory device and related peripheral circuits (particularly, peripheral circuits related to a program) are shown to simplify explanation of the present invention herein.

Referring now to the illustrated embodiments of FIG. 2, the nonvolatile memory device 100 includes a memory cell array 110, an input/output (I/O) buffer 120, a write driver 130, a row selector 150, a column selector 140, a high voltage generating unit 170, a wordline driver 180, a bitline driver 185, and a program control unit 190.

The memory cell array 110 includes a plurality of memory cells, each of which may have a cross-sectional structure as generally shown in FIG. 1. The input/output buffer 120 stores data to be written in the memory cell array 110, and stores data sensed from the memory cell array 110. The write driver 130 performs a program operation for a memory cell using data input from the input/output buffer 120. The column selector 140 selects a bitline of a memory cell to be programmed by the write driver 130 in response to an externally applied address Y_Add.

The high voltage generating unit 170 generates a bulk voltage VB, a pumped bitline voltage VPBL, and a wordline voltage VWL to program the nonvolatile memory device, and detects respective levels thereof. Further details of the high voltage generating unit 170 according to some embodiments of the present invention will now be described.

As shown in the embodiments of FIG. 3, the high voltage generating unit 170 includes a pumping circuit 171 and a level detector 173. The pumping circuit 171 includes first, second, and third pumping circuits 1711, 1712, and 1713 for generating the bulk voltage VB, the pumped bitline voltage VPBL, and the wordline voltage VWL, respectively. The level detector 173 includes first, second, third level detectors 1731, 1732, and 1733 for detecting respective levels of the bulk voltage VB, the pumped bitline voltage VPBL, and the wordline voltage VWL from the first, second, and third pumping circuits 1711, 1712, and 1713, respectively.

The first, second, and third pumping circuits 1711, 1712, and 1713 generate the bulk voltage VB, the pumped bitline voltage VPBL, and the wordline voltage VWL in response to a program command PGM_CMD. The bulk voltage VB, the pumped bitline voltage VPBL, and the wordline voltage VWL in the illustrated embodiments are generated at the same point of time (or concurrently). However, the bulk voltage VB, the pumped bitline voltage VPBL, and the wordline voltage VWL are applied to a memory cell array 100 at different time points. Respective applying time points of the bulk voltage VB, the pumped bitline voltage VPBL, and the wordline voltage VWL are shown in FIG. 4 for some embodiments of the present invention. The pumped bitline voltage VPBL may be applied to the bitline after clipping it down to a predetermined bitline voltage VBL, and the wordline voltage VWL may be applied to the wordline as seen by the shape of a ramped wordline voltage VRWL shown in FIG. 4. The ramped wordline voltage VRWL is shown as increased stepwise from a predetermined voltage level up to the wordline voltage VWL (or almost to the wordline voltage VWL).

The first, second, and third level detectors 1731, 1732, and 1733 receive the voltages VB, VPBL, and VWL generated by the first, second, and third pumping circuits 1711, 1712, and 1713, respectively, and detect voltage levels thereof. When the voltages VB, VPBL, and VWL reach a predetermined voltage level, the first, second, and third level detectors 1731, 1732, and 1733 generate corresponding sensed signals HVOK_B, HVOK_PBL, and HVOK_WL, respectively.

The bulk voltage VB is applied to a bulk region of the memory cell array 110 for the embodiments of FIG. 4 when it is generated by the pumping circuit 1711. The bulk voltage VB is shown as a negative voltage having a level of −1V. In some embodiments of the present invention, the negative voltage is applied to the bulk region during a program operation to reduce the risk of or prevent a current generated in a deselected memory cell from being leaked. However, in a state where the voltage level of the bulk voltage VB has not reached a sufficient magnitude, when the program operation advances, there can be a significant possibility of the occurrence of a leakage current due to a drain turn-on phenomenon. Accordingly, in some embodiments of the present invention, the time of applying a voltage is controlled so that a bitline voltage VBL and a ramped wordline voltage VRWL are applied at a time selected based on whether or not the level of the bulk voltage VB is sufficiently established. As a result, the drain turn-on phenomenon occurrence may be reduced or eliminated and the reliability of the program operation may be increased.

As shown in the embodiments of FIG. 2, the pumped bitline voltage VPBL generated by the second pumping circuit 1712 is applied to a bitline driver 185. The bitline driver 185 generates the bitline voltage VBL in response to an activated bitline enable signal BLEN generated from the program control unit 190. The bitline voltage VBL may be generated by clipping down the pumped bitline voltage VPBL to a predetermined voltage level. The generated bitline voltage VBL is applied to a bitline of a memory cell to be programmed through a write driver 130. The bitline voltage VBL is shown in FIG. 4 as a positive voltage having a level of about 5V. An applying time of the bitline voltage VBL is determined based on whether or not a voltage level of the bulk voltage VB is sufficiently established (see the arrow in FIG. 4).

The wordline voltage VWL generated by the third pumping circuit 1713 is applied to a wordline driver 180. The wordline driver 180 generates the ramped wordline voltage VRWL, in response to a program execution signal PGM_EXECUTE generated by the program control unit 190. The ramped wordline voltage VRWL is increased stepwise from a predetermined voltage level up to the wordline voltage VWL (or almost to the wordline voltage VWL), and is applied to a wordline of a memory cell to be programmed. The ramped wordline voltage VRWL may reach a positive voltage having a level of about 10V. An applying time of the ramped wordline voltage VRWL may be determined according to whether or not the bitline voltage VBL is activated and whether or not the voltages VB, VPBL, and VWL are sufficiently established. Control of applied timings of the bitline voltage VBL and the ramped wordline voltage VRWL according to some embodiments of the present invention will now be further described.

Referring to FIG. 2 and FIG. 4, the program control unit 190 controls timings (i.e., the time) at which the bitline voltage VBL generated from the bitline driver 185, and the ramped wordline voltage VRWL generated from the wordline driver 180 are applied, respectively. The program control unit 190 in the embodiments of FIG. 2 includes a first controller 191 and a second controller 193. The first controller 191 controls an applying time of the bitline voltage VBL according to a voltage level of the bulk voltage VB. The second controller 193 controls an applying time of the ramped wordline voltage VRWL according to the applying time of the bitline voltage VBL and respective levels of the voltages VB, VPBL and VWL.

More particularly, when the level detector 173 generates and provides a sensed signal HVOK_B indicating that the bulk voltage VB has reached a predetermined level, the first controller 191 generates an activated bitline enable signal BLEN in response to the sensed signal HVOK_B. The bitline driver 185 generates the bitline voltage VBL in response to the activated bitline enable signal BLEN, by clipping down the pumped bitline voltage VPBL to a predetermined voltage level. The write driver 130 applies the bitline voltage VBL to a bitline of a memory cell to be programmed.

The second controller 193 generates a program execution signal PGM_EXECUTE in response to the bitline enable signal BLEN generated by the first controller 191 and the sensed signals HVOK_B, HVOK_PBL, and HVOK_WL generated by the level detector 173. When the bitline enable signal BLEN is activated, and all the sensed signals HVOK_B, HVOK_PBL, and HVOK_WL are activated, the second controller 193 generates (activates) the program execution signal PGM_EXECUTE. As the program execution signal PGM_EXECUTE is generated by logical combinations of the signals BLEN, HVOK_B, HVOK_PBL, and HVOK_WL, with resultant delays in the logical operation circuitry, it is generated a predetermined time period Δt, for example, 50 ns, after the bitline enable signal BLEN is activated. The second controller 193 can also include a delay circuit therein to effectively control a generation (activation) timing of the program execution signal PGM_EXECUTE.

The wordline driver 180 steps the wordline voltage VWL up, responsive to the program execution signal PGM_EXECUTE generated by the program control unit 190. In particular, as seen in the embodiments of FIG. 4, the wordline driver 180 outputs the ramped wordline voltage VRWL to a row selector 150. The wordline driver 180 can generate the ramped wordline voltage VRWL through, for example, a ramper or an Incremental Step Pulse Programming (ISPP) circuit. The row selector 150 selects a wordline (not shown) of a memory cell to be programmed in response to an externally applied address X_Add. The ramped wordline voltage VRWL generated by the wordline driver 180 is applied to the wordline selected by the row selector 150 to start a program operation.

After programming of the memory cells is completed, a program verification operation for the programmed memory cells is generally performed. When the program verification operation starts, the program voltages VB, VBL, and VRWL provided to the memory cell array 110 are all initialized. The initialized program voltages VB, VBL, and VRWL are reset when a reprogramming operation starts.

Figure 5:
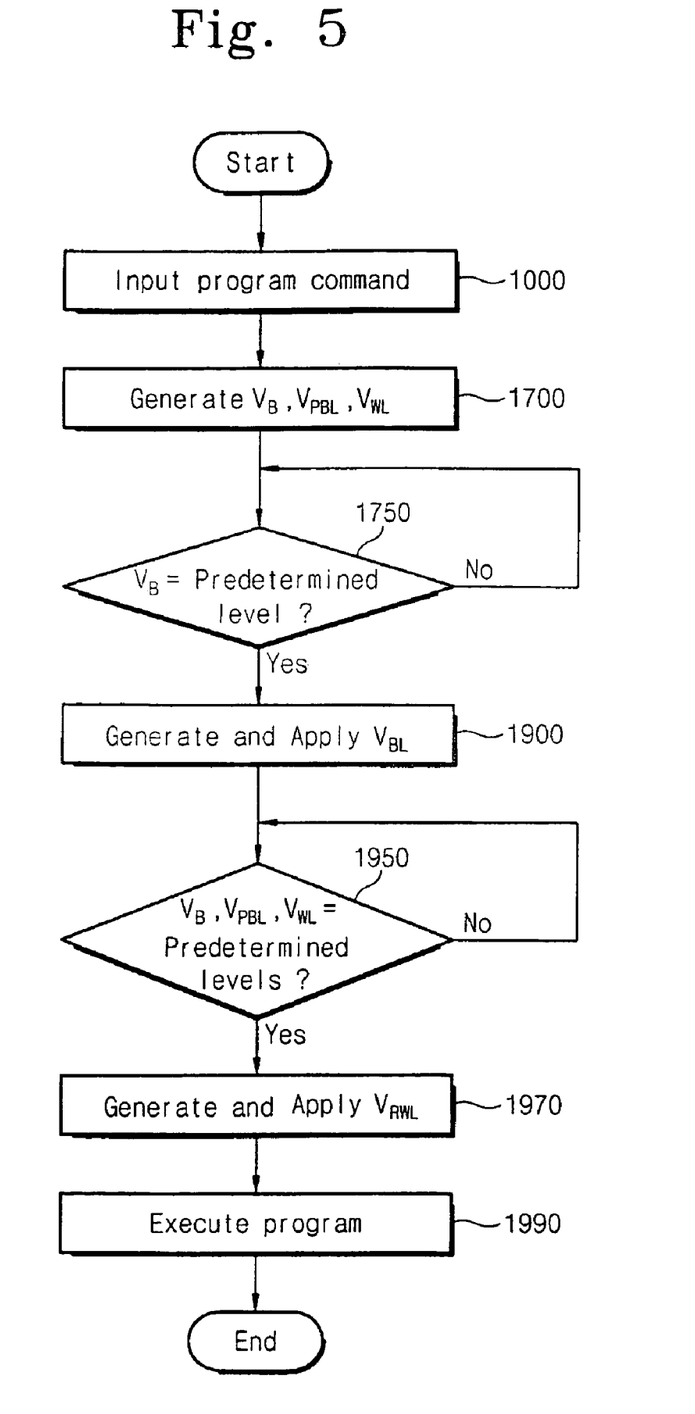
FIG. 5 is a flow chart illustrating programming methods for a nonvolatile semiconductor memory device according to some embodiments of the present invention.

FIG. 5 is a flow chart that illustrates program methods for a nonvolatile semiconductor memory device according to some embodiments of the present invention, for example, a program method for the nonvolatile semiconductor memory device 100.

Referring to the embodiments of FIG. 5, when a program command PGM_CMD is input to a pumping circuit 171 of a high voltage generating unit 170 (block 1000), the pumping circuit 171 generates a bulk voltage VB, a pumped bitline voltage VPBL, and a wordline voltage VWL (block 1700). At this time, the level detector 173 detects a level of the bulk voltage VB generated by the pumping circuit 171. Next, the first controller 191 of a program control unit 190 determines whether the bulk voltage VB has reached a predetermined level, for example,−1V, based on the detected result from the level detector 173 (block 1750).

When the bulk voltage VB is detected to have reached the predetermined level (block 1750), the first controller 191 generates an activated bitline enable signal BLEN, and applies it to a bitline driver 185. The bitline driver 185 generates the bitline voltage VBL, and applies it to a bitline of a memory cell to be programmed through a write driver 130 (block 1900). It is determined whether each of the bulk voltage VB, the pumped bitline voltage VPBL, and the wordline voltage VWL have reached a predetermined level (block 1950).

When the bulk voltage VB, the pumped bitline voltage VPBL, and the wordline voltage VWL have all reached the predetermined level (block 1950), the second controller 193 generates a program execution signal PGM_EXECUTE, and applies it to a wordline driver 180. The wordline driver 180 generates a ramped wordline voltage VRWL, and applies it to a wordline of a memory cell to be programmed through a row selector 150 (block 1970). Thereafter, a program operation is executed (block 1990).

Thus, for the illustrated embodiments of FIG. 4, after a predetermined time period Δt elapses following application of the bitline voltage VBL, the ramped wordline voltage VRWL is applied. The delay time before applying the ramped wordline voltage VRWL can be adjusted in some embodiments of the present invention using a delay circuit or the like.

As described above, the semiconductor memory device 100 according to some embodiments of the present invention generates voltages VB, VPBL, and VWL used in a program operation responsive to a program command. The generated voltages VB, VPBL, and VWL are not applied directly to the memory cells. Instead, after determining that a negative voltage VB to be applied to a bulk region has reached a predetermined level, the pumped bitline voltage VPBL and the wordline voltage VWL are sequentially applied after converting the bitline voltage VBL and the ramped wordline voltage VRWL. Thus, the bulk voltage VB applied to the bulk region has reached a predetermined voltage level selected to prevent (or limit) a drain turn-on problem. As a result, a leakage current from a deselected memory cell may be reduced or even prevented during the program operation, which may improve reliability of the program operation.

Figure 6:
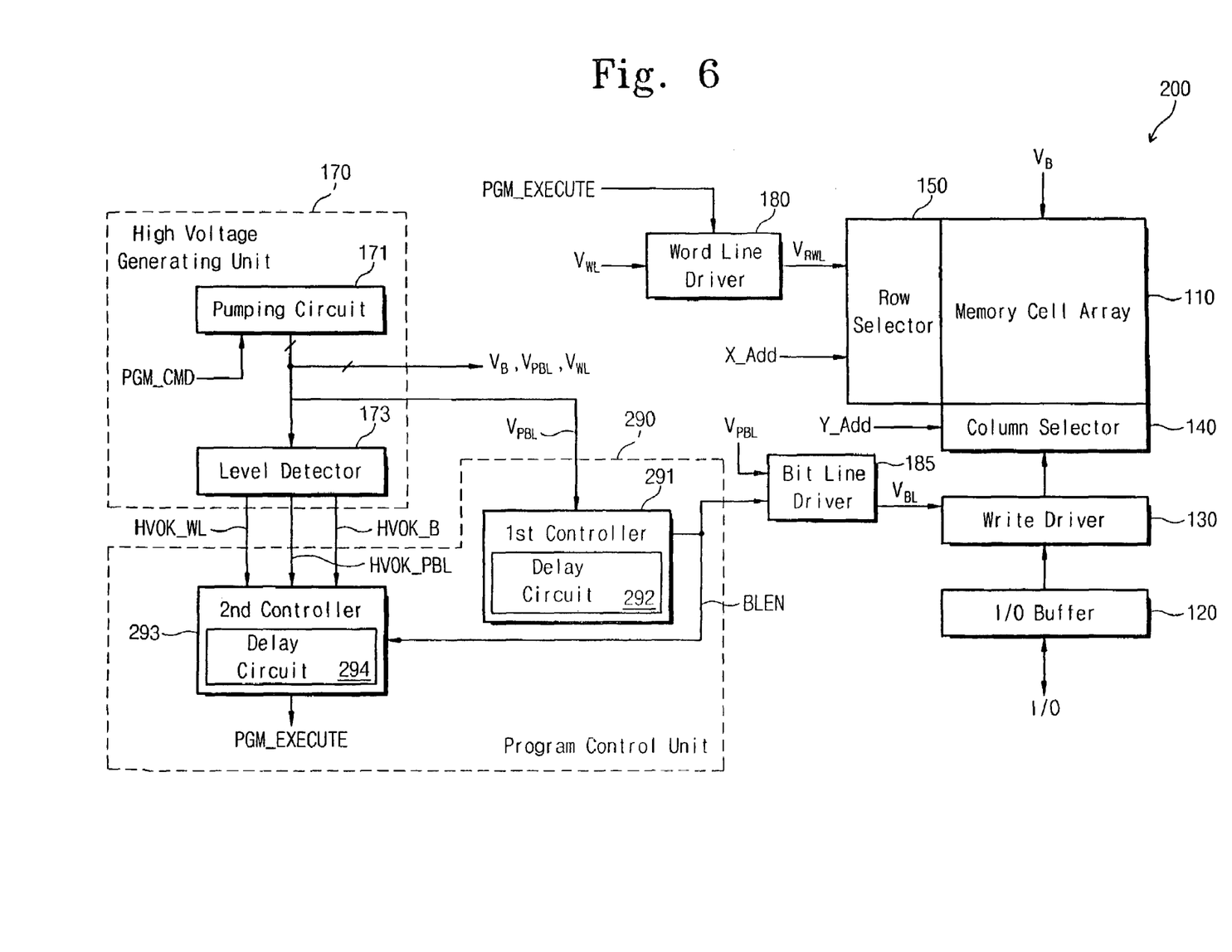
FIG. 6 is a circuit block diagram illustrating a nonvolatile semiconductor memory device according to further embodiments of the present invention.
Figure 7:
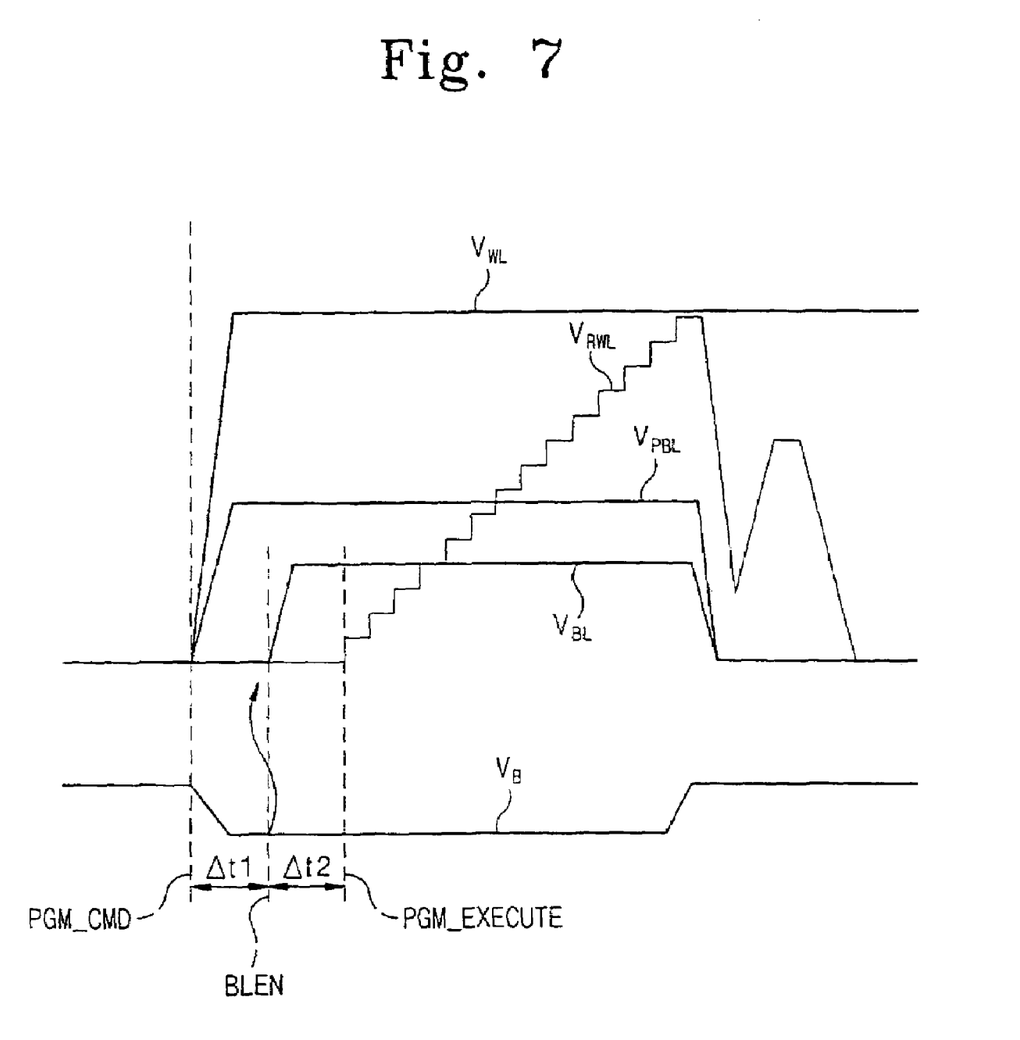
FIG. 7 is a waveform graph illustrating program voltages that are applied to the nonvolatile semiconductor memory device shown in FIG. 6 according to some embodiments of the present invention.

FIG. 6 is a block diagram illustrating a nonvolatile semiconductor memory device 200 according to other embodiments of the present invention. FIG. 7 is a waveform graph illustrating program voltages VB, VPBL, VBL, VWL and VRWL that are used for program of the nonvolatile semiconductor memory device 200 shown in FIG. 6 according to some embodiments of the present invention.

The non-volatile semiconductor memory device 200 of FIG. 6 differs from the non-volatile semiconductor memory device 100 of FIG. 1 in that a program control unit 290 differs from the program control unit 190. Accordingly, the description of the like elements will not be repeated herein and similarly numbered elements in the embodiments of FIG. 6 will be understood to generally correspond to the description thereof provided previously.

Referring now to the embodiments of FIG. 6 and FIG. 7, the nonvolatile semiconductor memory device 200 applies a bitline voltage VBL to a bitline of a memory cell to be programmed a predetermined time period Δt1 (more particularly, a time period selected to allow a bulk voltage VB of a stabilized level to be applied to the bulk region) after the voltages VB, VPBL and VWL are generated (activated). After an additional predetermined time period Δt2 elapses, the nonvolatile semiconductor memory device 200 applies a ramped wordline voltage VRWL to a wordline of a memory cell to be programmed. As a result of this timing control for applying the program voltages VB, VBL and VRWL, as sufficient time may be provided for the bulk voltage VB to reach a stabilized level applied to the bulk region, a drain turn-on problem may be reduced or prevented. Consequently, a leakage current flowing to a deselected memory cell during the program operation may be reduced or prevented, which may improve reliability of the program operation.

The nonvolatile semiconductor memory device 200 in the embodiments of FIG. 6 includes a program control unit 290 for controlling respective applied timings of the bitline voltage VBL and the ramped wordline voltage VRWL. The program control unit 290 of the illustrated embodiments includes a first controller 291 and a second controller 293. The first controller 291 controls a time when the bitline voltage VBL is applied so that the bitline voltage VBL is applied after a delay time selected to be sufficient to provide a bulk voltage VB to the bulk region at a stabilized level before application of the bitline voltage VBL. The second controller 293 controls a time at which the ramped wordline voltage VRWL is applied based on the applying time of the bitline voltage VBL and levels of the voltages VB, VPBL, and VWL.

More particularly, for the embodiments shown in FIG. 7, when a pumped bitline voltage VPBL from the pumping circuit 171 is generated, the first controller 291 generates an activated bitline enable signal BLEN a predetermined time period Δt1 after the pumped bitline voltage VPBL has been applied. In order to do this, the first controller 291 in the illustrated embodiments includes a delay circuit 292 and a timing control circuit therein. The time period Δt1 delayed by the first controller 291 is selected to be a time period sufficient to provide a stabilized bulk voltage VB to the bulk region. The delayed time period Δt1 may be selected based on experimental results of measurements of the device 200.

The bitline enable signal BLEN from the first controller 291 is input to a bitline driver 185. The bitline driver 185 generates the bitline voltage VBL in response to an activated bitline enable signal BLEN. The bitline voltage VBL may be generated by clipping down the pumped bitline voltage VPBL to a predetermined voltage level. The write driver 130 applies the bitline voltage VBL to the bitline of a memory cell to be programmed.

When the sensed signals HVOK_B, HVOK_PBL, and HVOK_WL are all activated, and after a predetermined time period Δt2 (e.g., 50 ns) elapses since the bitline enable signal BLEN was activated, the second controller 293 generates an activated program execution signal PGM_EXECUTE. If at least one of the sensed signals HVOK_B, HVOK_PBL, and HVOK_WL is inactivated when BLEN is activated, the second controller 293 does not generate the program execution signal PGM_EXECUTE. The second controller 293 in the illustrated embodiments includes a delay circuit 294 or other timing control circuit for controlling a timing of activating the program execution signal PGM_EXECUTE.

Figure 8:
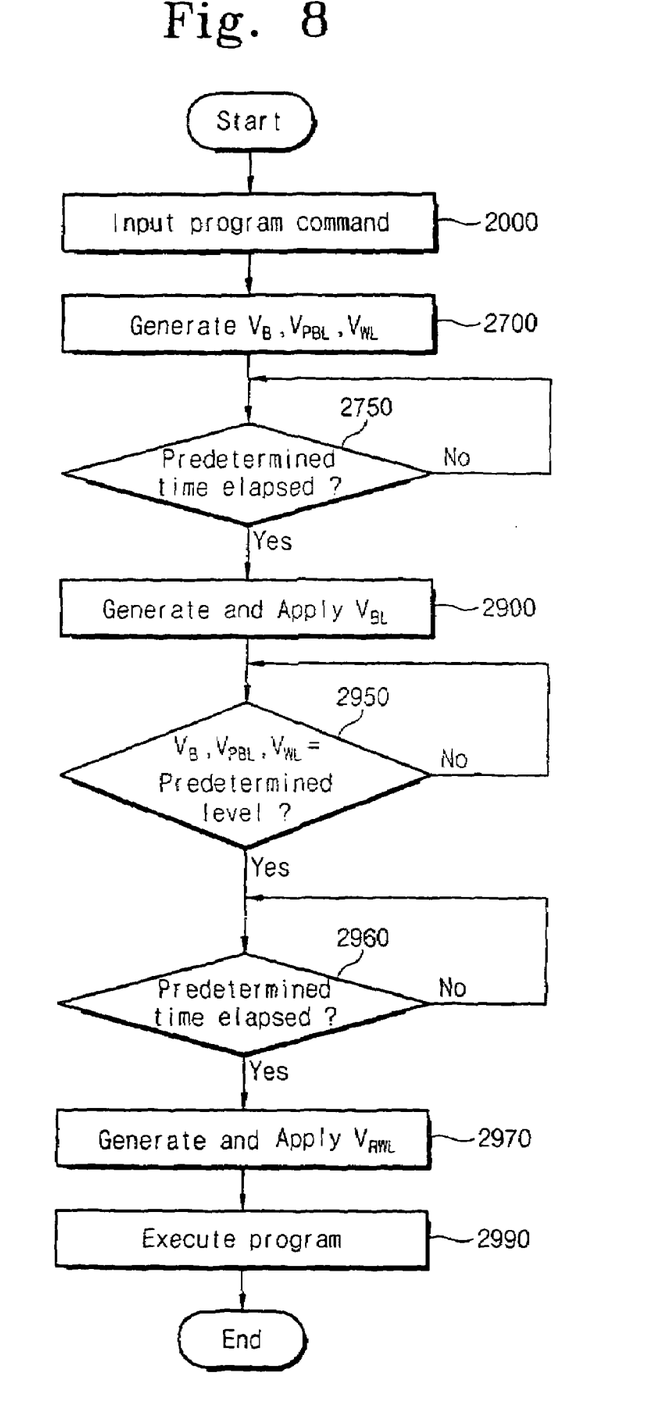
FIG. 8 is a flow chart illustrating programming methods for a nonvolatile semiconductor memory device according to further embodiments of the present invention.

FIG. 8 is a flow chart that illustrates program methods of a nonvolatile semiconductor memory device according to other embodiments of the present invention, for example, for programming the nonvolatile semiconductor memory device 200 shown in FIG. 6. Referring to FIG. 8, when a program command PGM_CMD is input to a pumping circuit 171 of a high voltage generating unit 170 (block 2000), the pumping circuit 171 generates a bulk voltage VB, a pumped bitline voltage VPBL, and a wordline voltage VWL (block 2700). Next, the first controller 291 of a program control unit 290 determines whether a predetermined time period Δt1 (such as a time period selected to provide a stabilized voltage VB level to be applied to the bulk region) has elapsed (block 2750).

When the predetermined time period Δt1 has elapsed (block 2750), the first controller 291 generates an activated bitline enable signal BLEN, and applies it to a bitline driver 185. The bitline driver 185 generates the bitline voltage VBL, and applies it to a bitline of a memory cell to be programmed through a write driver 130 (block 2900). It is determined whether or not each of the bulk voltage VB, the pumped bitline voltage VPBL, and the wordline voltage VWL have reached a predetermined level (block 2950).

When all of the bulk voltage VB, the pumped bitline voltage VPBL, and the wordline voltage VWL reach the predetermined level (block 2950), it is determined whether a predetermined time period Δt2 has elapsed since the bitline voltage VBL was applied (block 2960). When the predetermined time period Δt2 has elapsed (block 2960), the second controller 293 generates a program execution signal PGM_EXECUTE, and applies it to a wordline driver 180. The wordline driver 180 generates a ramped wordline voltage VRWL, and applies it to a wordline of a memory cell to be programmed through a row selector 150 (block 2970). Thereafter, a program operation is executed (block 2990).

As mentioned above, the semiconductor memory device 200 according to some embodiments of the present invention generates voltages VB, VPBL, and VWL responsive to a program command. The generated voltages VB, VPBL, and VWL are not directly applied to a memory cell array. Instead, after delaying a time period selected so that a negative voltage VB applied to a bulk region reaches a predetermined level (generally a negative voltage level), the pumped bitline voltage VPBL and the wordline voltage VWL (as a stepping voltage VRWL) are sequentially applied after converting to the bitline voltage VBL and the ramped wordline voltage VRWL, respectively. Accordingly, the bulk voltage VB applied to the bulk region may reach a predetermined voltage level before programming, which may prevent or limit occurrence of a drain turn-on problem. This may, in turn, limit or even prevent a leakage current from flowing to a deselected memory cell during the program operation, and may improve the reliability of the program operation.

In accordance with some embodiments of the present invention described above, a drain turn-on problem occurring during a program operation of the nonvolatile memory device may be limited or prevented. As a result, a leakage current may be prevented from flowing to a deselected memory cell during the program operation, which may cause an improvement of the reliability of a program operation.

The flowcharts of FIGS. 5 and 8 illustrate the functionality and operation of possible implementations of methods for programming a memory device according to various embodiments of the present invention. It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method of programming a nonvolatile integrated circuit memory device, the method comprising:
   generating first, second, and third program voltages for use in programming memory cells of the memory device; and
   controlling times of applying the second and third program voltages to the memory cells responsive to a level of the first program voltage;
   wherein controlling times of applying comprises:
   applying the first program voltage to a bulk region of the memory cells; and applying the second and third program voltages to a memory cell to be programmed responsive to the applied first program voltage reaching a predetermined level.

2. The method of claim 1, wherein applying the second and third program voltages comprises:
   applying the second program voltage to a bitline of the memory cell to be programmed responsive to the first program voltage reaching the predetermined level; and then
   applying the third program voltage to a wordline of the memory cell to be programmed responsive to the first, second, and third program voltages reaching predetermined levels.

3. The method of claim 2, wherein applying the second program voltage to a bitline of the memory cell to be programmed comprises:
   clipping down the second program voltage to a predetermined voltage level; and
   applying the second program voltage to the bitline.

4. The method of claim 2, wherein applying the third program voltage to a wordline of the memory cell to be programmed comprises:
   stepping up a voltage from a predetermined voltage level to the third program voltage level; and
   applying the stepping voltage to the wordline.

5. The method of claim 3, wherein the third program voltage is a positive voltage having a predetermined desired positive level higher than the predetermined desired positive level of the second program voltage.

6. The method of claim 1, wherein the first program voltage comprises a negative voltage and wherein the predetermined voltage of the first program voltage comprises a predetermined negative level.

7. The method of claim 1, wherein the second program voltage is a positive voltage having a predetermined desired positive level.

8. The method of claim 1, wherein a program operation begins responsive to applying of the third program voltage.

9. The method of claim 1, wherein the nonvolatile integrated circuit memory device comprises a flash memory device.

10. A method of programming a nonvolatile integrated circuit memory device, the method comprising:
generating first, second, and third program voltage for use in programming memory cells of the memory device; and
sequentially applying the first, second, and third program voltages to the memory cells at predetermined intervals;
wherein the nonvolatile memory device comprises a flash memory device and wherein sequentially applying comprises:
applying the first program voltage to a bulk region of the memory cells;
applying the second program voltage to a bitline of a memory cell to be programmed when a first predetermined time has elapsed after applying the first program voltage; and
applying the third program voltage to a wordline of the memory cell to be programmed when a second predetermined time has elapsed after applying the first program voltage.

11. The method of claim 10, wherein applying the second program voltage to a bitline of the memory cell to be programmed comprises:
clipping down the second program voltage to a predetermined voltage level; and
applying the second program voltage to the bitline.

12. The method of claim 11, wherein the first program voltage comprises a predetermined negative voltage and wherein the second program voltage comprises a predetermined positive voltage.

13. The method of claim 11, wherein the first predetermined time is selected to allow the first program voltage reach a desired stabilized level.

14. The method of claim 10, wherein applying the third program voltage to a wordline of the memory cell to be programmed comprises:
stepping up a voltage from a predetermined voltage level to the third program voltage level; and
applying the stepping voltage to the wordline.

15. The method of claim 14, wherein the third program voltage is a positive voltage higher than the second program voltage.

16. The method of claim 10 wherein applying the third program voltage comprises applying the third program voltage a delay time after applying the second program voltage and wherein the second predetermined time comprises the first predetermined time combined with the delay time after applying the second program voltage.

17. The method of claim 10, wherein a program operation begins responsive to applying of the third program voltage.

18. A nonvolatile integrated circuit memory device comprising:
a memory cell array having a plurality of memory cells;
a high voltage generating unit that generates first, second, and third program voltages used in programming the memory cell array; and
a program control unit that controls times of applying the second and third program voltages to the memory cell array responsive to the first program voltage;
wherein the nonvolatile integrated circuit memory device comprises a flash memory and wherein the program control unit is configured to control times of applying the second and third program voltages responsive to a level of the first program voltage.

19. The memory device of claim 18, wherein the high voltage generating unit comprises:
a pumping circuit that generates the first, second, and third program voltages responsive to a program command; and
a level detector that detects voltage levels of the first, second, and third program voltages.

20. The memory device of claim 19, wherein the program control unit comprises:
a first controller that applies the second program voltage to a bitline of a memory cell to be programmed when the first program voltage reaches a predetermined level; and
a second controller that applies the third program voltage to a wordline of the memory cell to be programmed when the first, second, and third program voltages all reach predetermined levels.

21. The memory device of claim 20, wherein the second controller further comprises a delay circuit that delays applying the third program voltage for a predetermined time period.

22. The memory device of claim 18, wherein the first program voltage is applied to a bulk region of the memory cell array.

23. The memory device of claim 18, wherein the first program voltage is a predetermined negative voltage.

24. The memory device of claim 18, wherein the second program voltage comprises a predetermined positive voltage.

25. The memory device of claim 24, wherein the third program voltage comprises a positive voltage higher than the second program voltage.

26. The memory device of claim 18, wherein the third program voltage comprises a stepping voltage that increases by stages.

27. The memory device of claim 18 wherein the nonvolatile memory device comprises a flash memory device and wherein the program control unit is configured to sequentially apply the first, second, and third program voltages to the memory cell array at predetermined intervals.

28. The flash memory device of claim 27, wherein a program operation begins responsive to applying of the third program voltage.

29. A nonvolatile integrated circuit memory device comprising:
a memory cell array having a plurality of memory cells;
a high voltage generating unit that generates first, second, and third program voltages used in programming the memory cell array; and
a program control unit that controls times of applying the second and third program voltages to the memory cell array responsive to the first program voltage;

wherein the high voltage generating unit comprises:
a pumping circuit that generates the first, second, and third program voltages responsive to a program command; and
a level detector that detects voltage levels of the first, second, and third program voltages.

30. The memory device of claim 29, wherein the pumping circuit applies the first program voltage to a bulk region of the memory cell array and wherein the program control unit comprises:
a first controller that applies the second program voltage to a bitline of a memory cell to be programmed a predetermined time after applying of the first program voltage; and
a second controller that applies the third program voltage to a wordline of the memory cell to be programmed a predetermined time after applying of the second program voltage.

31. The memory device of claim 30, wherein the first controller comprises a delay circuit that delays applying the second program voltage for a predetermined time and wherein the second controller comprises a delay circuit that delays applying the third program voltage for a predetermined time.

32. The memory device of claim 30, wherein the second controller is configured to apply the third program voltage to the wordline of the memory cell to be programmed only when the first, second, and third program voltages all become predetermined levels.

33. A nonvolatile integrated circuit memory device comprising:
a memory cell array having a plurality of memory cells;
a high voltage generating unit that generates first, second, and third program voltages used in programming the memory cell array; and
a program control unit that controls times of applying the second and third program voltages to the memory cell array responsive to the first program voltage; and
wherein:
the second program voltage is applied after a delay time selected to allow the first program voltage to reach a desired stabilized level; and/or
the third program voltage comprises a stepping voltage that increases by stages.

34. The memory device of claim 33, wherein the third program voltage comprises a stepping voltage that increases by stages.

35. The memory device of claim 33, wherein the second program voltage is applied after a delay time selected to allow the first program voltage to reach a desired stabilized level.

* * * * *